(12) United States Patent
Liu et al.

(10) Patent No.: US 10,620,289 B2
(45) Date of Patent: Apr. 14, 2020

(54) CORRECTION METHOD AND APPARATUS FOR MAGNETIC RESONANCE DIFFUSION WEIGHTED IMAGING IMAGE

(71) Applicant: Siemens Aktiengesellschaft, Munich (DE)

(72) Inventors: Wei Liu, Shenzhen (CN); Kun Zhou, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/199,469

(22) Filed: Nov. 26, 2018

(65) Prior Publication Data

US 2019/0094325 A1 Mar. 28, 2019

Related U.S. Application Data

(63) Continuation of application No. 14/606,377, filed on Jan. 27, 2015, now abandoned.

(30) Foreign Application Priority Data

Jan. 27, 2014 (CN) .......................... 2014 1 0041042

(51) Int. Cl.
*G01V 3/00* (2006.01)
*G01R 33/565* (2006.01)
*G01R 33/563* (2006.01)

(52) U.S. Cl.
CPC ... *G01R 33/5659* (2013.01); *G01R 33/56341* (2013.01)

(58) Field of Classification Search
USPC ........................................................ 324/307
See application file for complete search history.

(56) References Cited

U.S. PATENT DOCUMENTS

2006/0261809 A1 11/2006 Fuderer et al.
2012/0271584 A1 10/2012 Xu et al.
(Continued)

FOREIGN PATENT DOCUMENTS

CN 1842720 A 10/2006
CN 102711602 A 10/2012
(Continued)

OTHER PUBLICATIONS

"Measurement and Correction of Transmitter and Receiver Induced Nonuniformities In Vivo," Wang et al., Magnetic Resonance in Medicine, vol. 53 (2005), pp. 408-417. (Year: 2005).*
(Continued)

*Primary Examiner* — Rodney E Fuller
(74) *Attorney, Agent, or Firm* — Schiff Hardin LLP

(57) ABSTRACT

In a correction method and apparatus for a magnetic resonance diffusion weighted imaging image, a diffusion weighted imaging image is corrected based on a launch site correction factor and/or a receiving field correction factor. The launch site correction factor is used for correcting inhomogeneity of a launch site, and the receiving field correction factor is used for correcting inhomogeneity of a receiving field. The imaging sequence of the diffusion weighted imaging image is thereby improved and the corresponding image reconstruction of the diffusion weighted imaging image, and the homogeneity of the diffusion weighted imaging image also can be improved, without measuring the intensity of the launch site, which significantly reduces the correction workload and is easy to automate.

23 Claims, 4 Drawing Sheets

(56) References Cited

U.S. PATENT DOCUMENTS

| | | | |
|---|---|---|---|
| 2013/0015855 A1 | 1/2013 | Machii et al. | |
| 2013/0249555 A1 | 9/2013 | Chen et al. | |
| 2014/0062477 A1* | 3/2014 | Carroll | G01R 33/4826 324/309 |
| 2015/0071514 A1 | 3/2015 | Wang et al. | |
| 2015/0212181 A1 | 7/2015 | Liu et al. | |
| 2016/0310761 A1 | 10/2016 | Li et al. | |
| 2018/0120403 A1* | 5/2018 | Liu | G01R 33/482 |

FOREIGN PATENT DOCUMENTS

| | | |
|---|---|---|
| CN | 102778662 A | 11/2012 |
| WO | 2012088031 A2 | 6/2012 |

OTHER PUBLICATIONS

"Measurement and Correction of Transmitter and Receiver Induced Nonuniformities In Vivo," Wang et al., MAgnetic Resonance in Medicine, vol. 53 (2005), pp. 408-417. D.

"Non-uniformity correction of human brain imaging at high field by RF field mapping of B1 + and B1-," Watanabe et al., D Journal of Magnetic Resonance, vol. 212 (2011), pp. 426-430.

Readout-segmented DWI, Why does readout-segmented DWI produce better looking images (2017).

Scanogram, Techniques, applications, resources, and news of interest for HMSA users (2018).

Chinese Office Action dated Apr. 11, 2018, for Application No. 2018040801702790.

Chinese Office Action dated Dec. 26, 2016, for Application No. 2016122102029620.

\* cited by examiner

CORRECTION METHOD AND APPARATUS FOR MAGNETIC RESONANCE DIFFUSION WEIGHTED IMAGING IMAGE

BACKGROUND OF THE INVENTION

Field of the Invention

The present invention relates to the field of medical appliances, and in particular to a correction method and apparatus for a magnetic resonance diffusion weighted imaging image.

Description of the Prior Art

Magnetic resonance diffusion weighted imaging (DWI) can detect water molecule diffusion motion in a viable tissue. The water molecule diffusion state (freedom and direction) in the tissue is detected by measuring the change in signal intensity of the tissue before and after applying a diffusion sensitive gradient field, and the detection result can indirectly reflect the tissue microscopic structure characteristics and changes thereof.

DWI technology can be widely used for identifying infarction and other pathological states. However, inhomogeneous rotating magnetic field B1 causes inhomogeneous DWI image signal intensity, thereby decreasing image quality and easily causing misdiagnosis, and this defect is much more obvious in the case of a strong magnetic field. Inhomogeneity of the signal intensity of a DWI image is largely due to two factors. One factor is inhomogeneity of a launch site B1+, which arises from an interaction between a radio frequency (RF) field and the human body; the other factor is inhomogeneity of a receiving field B1−, which corresponds to the signal intensity that is introduced by a receiving coil and normally varies with space.

Conventionally, in order to correct inhomogeneity of the DWI image, it is generally required to measure the intensity of the launch site B1+, and then correct the DWI image based on the intensity of the launch site B1+.

However, measuring the intensity of the launch site B1+ will entail heavy workload, and therefore this correction method is difficult to implement and has a low degree of automation.

SUMMARY OF THE INVENTION

An object of the present invention is to provide a correction method for a magnetic resonance diffusion weighted imaging image, which can be implemented easily.

A further object of the present invention is to provide a correction apparatus for a magnetic resonance diffusion weighted imaging image, which can be operated easily to achieve the correction.

A correction method for a magnetic resonance diffusion weighted imaging image in accordance with the invention includes correcting a DWI image based on a launch site (radiation site, emission site) correction factor and/or a receiving field correction factor, wherein the launch site correction factor is used for correcting inhomogeneity of a launch site, and the receiving field correction factor is used for correcting inhomogeneity of a receiving field.

The method further includes determining the launch site correction factor based on an excitation pulse flip angle actual value of the DWI image and a refocusing pulse flip angle actual value corresponding thereto, and/or calculating the receiving field correction factor based on a pulse flip angle correction factor.

The calculating of the receiving field correction factor based on a pulse flip angle correction factor includes calculating a reciprocal of the pulse flip angle correction factor, and determining the reciprocal as the receiving field correction factor.

The method further includes calculating the excitation pulse flip angle actual value and the refocusing pulse flip angle actual value based on the pulse flip angle correction factor.

The method further includes calculating an excitation pulse flip angle actual value of a first DWI scanning according to an image signal intensity of the first and a second DWI scanning and a preset relationship between excitation pulse flip angle setting values of the first and second DWI scanning, and determining the pulse flip angle correction factor according to a ratio of the excitation pulse flip angle actual value of the first DWI scanning to the excitation pulse flip angle setting value of the first DWI scanning.

The preset relationship is that, for the same diffusion sensitive factor, the excitation pulse flip angle setting value of the second DWI scanning is N times the excitation pulse flip angle setting value of the first DWI scanning, where N is a positive number. The excitation pulse flip angle actual value $\alpha_{actual}$ of the first DWI scanning is determined according to a first general formula, and the first general formula is $$\frac{\sin(N * \alpha_{actual})}{\sin \alpha_{actual}} = \frac{S_{2,measured}}{S_{1,measured}};$$

wherein $S_{1,measured}$ denotes the image signal intensity of the first DWI scanning, and $S_{2,measured}$ denotes the image signal intensity of the second DWI scanning.

The value of N is 2.

The excitation pulse flip angle setting value of the first DWI scanning is 60 degrees.

The launch site correction factor is determined, based on an excitation pulse flip angle actual value and a refocusing pulse flip angle actual value corresponding thereto, according to a second general formula, wherein the second general formula is $$C^+ = \frac{\sin \theta_{1,nominal} \sin^2(\theta_{2,nominal}/2)}{\sin \theta_{1,actual} \sin^2(\theta_{2,actual}/2)};$$

wherein $C^+$ denotes the launch site correction factor, $\theta_{1,actual}$ denotes the excitation pulse flip angle actual value, $\theta_{2,actual}$ denotes the refocusing pulse flip angle actual value corresponding to $\theta_{1,actual}$, $\theta_{1,nominal}$ denotes the excitation pulse flip angle setting value corresponding to $\theta_{1,actual}$, and $\theta_{2,nominal}$ denotes the refocusing pulse flip angle actual value corresponding to $\theta_{1,nominal}$.

The diffusion sensitive factor is zero.

A correction apparatus for a magnetic resonance diffusion weighted imaging image has a correction factor acquisition unit and a correction unit, wherein the correction factor acquisition unit is designed (configured) to acquire a launch site correction factor and/or a receiving field correction factor, wherein the launch site correction factor is used for correcting inhomogeneity of a launch site, and the receiving field correction factor is used for correcting inhomogeneity of a receiving field. The correction unit is designed to correct a DWI image based on the launch site correction factor and/or the receiving field correction factor.

The correction factor acquisition unit is designed to determine the launch site correction factor based on an excitation pulse flip angle actual value of the DWI image and a refocusing pulse flip angle actual value corresponding thereto, and/or to calculate the receiving field correction factor based on a pulse flip angle correction factor.

The correction factor acquisition unit is designed to calculate a reciprocal of the pulse flip angle correction factor, and determining the reciprocal as the receiving field correction factor.

The correction factor acquisition unit is designed to calculate the excitation pulse flip angle actual value and the refocusing pulse flip angle actual value based on the pulse flip angle correction factor.

The correction factor acquisition unit is designed to calculate an excitation pulse flip angle actual value of a first DWI scanning according to an image signal intensity of the first and a second DWI scanning and a preset relationship between excitation pulse flip angle setting values of the first and second DWI scanning, and determining the pulse flip angle correction factor according to a ratio of the excitation pulse flip angle actual value of the first DWI scanning to the excitation pulse flip angle setting value of the first DWI scanning.

The preset relationship is that, for the same diffusion sensitive factor, the excitation pulse flip angle setting value of the second DWI scanning is N times the excitation pulse flip angle setting value of the first DWI scanning, wherein N is a positive number, and the excitation pulse flip angle actual value $\alpha_{actual}$ of the first DWI scanning is determined according to a first general formula, and the first general formula is expressed as $$\frac{\operatorname{Sin}(N * \alpha_{actual})}{\operatorname{Sin}\alpha_{actual}} = \frac{S_{2,measured}}{S_{1,measured}};$$

wherein $S_{1,measured}$ denotes the image signal intensity of the first DWI scanning, and $S_{2,measured}$ denotes the image signal intensity of the second DWI scanning.

The value of N is 2.

The excitation pulse flip angle setting value of the first DWI scanning is 60 degrees.

The correction factor acquisition unit is designed to determine the launch site correction factor, based on an excitation pulse flip angle actual value and a refocusing pulse flip angle actual value corresponding thereto, according to a second general formula, wherein the second general formula is $$C^+ = \frac{\sin\theta_{1,nominal} \sin^2(\theta_{2,nominal}/2)}{\sin\theta_{1,actual} \sin^2(\theta_{2,actual}/2)};$$

wherein $C^+$ denotes the launch site correction factor, $\theta_{1,actual}$ denotes the excitation pulse flip angle actual value, $\theta_{2,actual}$ denotes the refocusing pulse flip angle actual value corresponding to $\theta_{1,actual}$, $\theta_{1,nominal}$ denotes the excitation pulse flip angle setting value corresponding to $\theta_{1,actual}$, and $\theta_{2,nominal}$ denotes the refocusing pulse flip angle actual value corresponding to $\theta_{1,nominal}$.

The diffusion sensitive factor is zero.

From the above, it can be seen that the correction method for a magnetic resonance diffusion weighted imaging image includes correcting a DWI image based on a launch site correction factor and/or a receiving field correction factor, wherein the launch site correction factor is used for correcting inhomogeneity of a launch site, and the receiving field correction factor is used for correcting inhomogeneity of a receiving field. It can be seen that, after applying the embodiments of the present invention, the DWI sequence and the corresponding DWI image reconstruction are improved, and the homogeneity of the DWI image can be improved without measuring the intensity of the launch site $B1^+$, which significantly reduces the correction workload and which is easy to automate.

DESCRIPTION OF THE PREFERRED EMBODIMENTS

In order to make the technical solution and advantages of the present invention more apparent, the present invention will be further described in detail in conjunction with the accompanying drawings and embodiments. It should be understood that particular embodiments described herein are merely used for illustrating the present invention and not intended to limit the scope of protection of the present invention.

In an embodiment of the present invention, the DWI sequence of the corresponding DWI image reconstruction is improved, and the homogeneity of the DWI image can be improved without measuring intensity of the launch site $B1^+$.

In a conventional DWI sequence, in a first scanning (repetition 1), when a diffusion sensitive factor b=0, the excitation pulse flip angle is set to 90 degrees, and for other scanning with a b value, the excitation pulse flip angles are set similarly to 90 degrees.

In a second scanning (repetition 2), when the diffusion sensitive factor b=0, the excitation pulse flip angle is set to 90 degrees, and for other scanning with a b value, the excitation pulse flip angles are set similarly to 90 degrees.

In the embodiment of the present invention, the conventional DWI imaging sequence is improved. By setting a preset relationship between the excitation pulse flip angle setting values of the first and second DWI scanning, a launch site correction factor and/or a receiving field correction factor for subsequent correction of DWI images can be calculated according to the image signal intensity of the first and second DWI scanning and the preset relationship. In an embodiment of the present invention, a DWI image is corrected based on a launch site correction factor and/or a receiving field correction factor, wherein the launch site correction factor is used for correcting inhomogeneity of a launch site, and the receiving field correction factor is used for correcting inhomogeneity of a receiving field.

Figure 1:
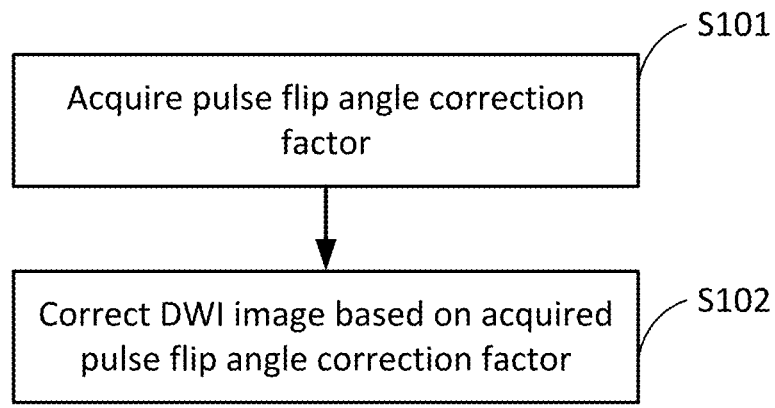
FIG. 1 is a flowchart of a correction method for a magnetic resonance diffusion weighted imaging image according to an embodiment of the present invention.

FIG. 1 is a flowchart of a correction method for a magnetic resonance diffusion weighted imaging image according to an embodiment of the present invention.

As shown in FIG. 1, the method includes Step 101, wherein a pulse flip angle correction factor is acquired based on the preset relationship between the excitation pulse flip angle setting values of the first and second DWI scanning and the image signal intensity of the first and second DWI scanning.

Here, the preset relationship between the excitation pulse flip angle setting values of the first and second DWI scanning can comprise: corresponding to a same diffusion sensitive factor, the excitation pulse flip angle setting value of the second DWI scanning is set to any multiple of the excitation pulse flip angle setting value of the first DWI scanning. That is to say, only the excitation pulse flip angle setting value of the first DWI scanning and a multiple relationship between the excitation pulse flip angle setting values of the first and second DWI scanning need to be clear.

In fact, for the first and second DWI scanning, the values of the diffusion sensitive factor b used by them can vary, as long as the values of b used in the first and second DWI scanning are the same. For example, for the first and second DWI scanning, in the case of the diffusion sensitive factor b=0, a pulse flip angle correction factor with a better correction effect can be calculated.

Preferably, the excitation pulse flip angle setting value of the second DWI scanning is twice the excitation pulse flip angle setting value of the first DWI scanning. More preferably, the excitation pulse flip angle setting value of the first DWI scanning is set to 60 degrees, and the excitation pulse flip angle setting value of the second DWI scanning is 120 degrees.

Figure 2:
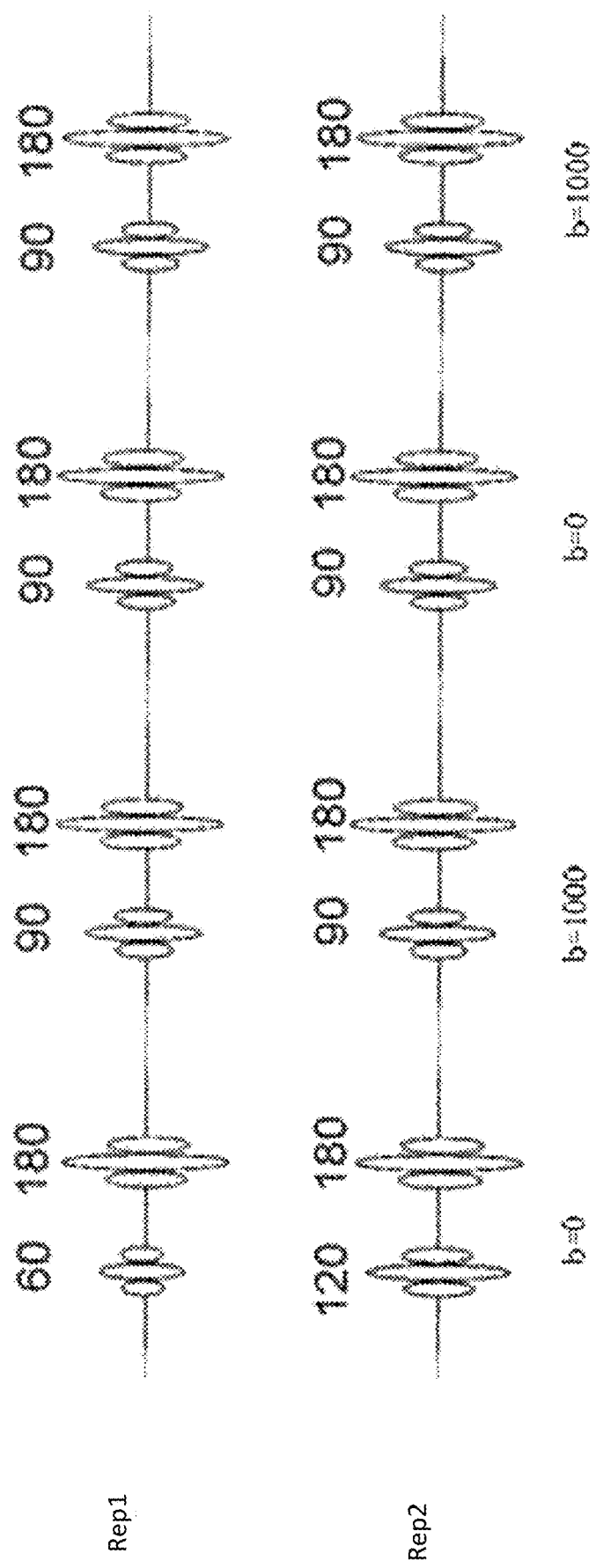
FIG. 2 is a schematic diagram of a radio frequency pulse flip angle according to an embodiment of the present invention.

FIG. 2 is a schematic diagram of a radio frequency pulse flip angle according to an embodiment of the present invention. In FIG. 2, the diffusion mode is: three direction scanning, b=0, 1000 s/mm².

As shown in FIG. 2, in the first scanning (Rep 1), for b=0, the excitation pulse flip angle is set to 60 degrees, and the refocusing pulse flip angle is set to 180 degrees. For a first direction with b=1000, the excitation pulse flip angle is set to 90 degrees, and the refocusing pulse flip angle is set to 180 degrees. For a second direction with b=0, the excitation pulse flip angle is set to 90 degrees, and the refocusing pulse flip angle is set to 180 degrees. For a third direction with b=1000, the excitation pulse flip angle is set to 90 degrees, and the refocusing pulse flip angle is set to 180 degrees.

In the second scanning (Rep 2), for b=0, the excitation pulse flip angle is set to 120 degrees, and the refocusing pulse flip angle is set to 180 degrees. For a first direction with b=1000, the excitation pulse flip angle is set to 90 degrees, and the refocusing pulse flip angle is set to 180 degrees. For a second direction with b=0, the excitation pulse flip angle is set to 90 degrees, and the refocusing pulse flip angle is set to 180 degrees. For a third direction with b=1000, the excitation pulse flip angle is set to 90 degrees, and the refocusing pulse flip angle is set to 180 degrees.

The preset relationship between the excitation pulse flip angle setting values of the first and second DWI scanning is described above in detail by examples. Those skilled in the art will recognize that these examples are exemplary only, and not intended to limit the protection scope of the embodiment of present invention.

For a DWI image, its signal intensity S is as following:

$$S = M_0 \sin\theta_1 \sin^2(\theta_2/2) \frac{(1 + (\cos\theta_2 - 1)e^{-(TR-TE/2)/T_1} - \cos\theta_2 e^{-TR/T_1})}{1 - \cos\theta_1 \cos\theta_2 e^{-TR/T_1}} \times e^{-TE/T_2} \times e^{-bD};$$

wherein $M_0$ is steady state magnetization intensity; TE is echo time; TR is repetition time; $T_2$ is transverse relaxation time; $T_1$ is longitudinal relaxation time; D is spreading factor; $\theta_1$ is excitation pulse flip angle; $\theta_2$ is refocusing pulse flip angle; and b is diffusion sensitive factor.

When TR>>T1, it can be simplified as:

$$S = M_0 \sin\theta_1 \sin^2(\theta_2/2) \times e^{-TE/T_2} \times e^{-bD}.$$

Due to inhomogeneity of B1, an excitation pulse flip angle actual value is not normally equal to the excitation pulse flip angle setting value, and therefore an actually acquired image is different from that calculated by theory and needs to be corrected.

The pulse flip angle correction factor can be calculated based on the image signal intensity of two DWI images obtained by two scannings with the same diffusion sensitive factor and the preset relationship between the excitation pulse flip angle setting values of the first and second magnetic resonance diffusion weighted imaging DWI scanning.

In an embodiment, an excitation pulse flip angle actual value of the first DWI image scanning is calculated according to the image signal intensity of the first and second DWI scanning and the preset relationship between the excitation pulse flip angle setting values of the first and second DWI scanning, and the pulse flip angle correction factor is determined according to the excitation pulse flip angle actual value of the first DWI scanning and the excitation pulse flip angle setting value of the first DWI scanning.

In an embodiment, an excitation pulse flip angle actual value of the second DWI image scanning is calculated according to the image signal intensity of the first and second DWI scanning and the preset relationship between the excitation pulse flip angle setting values of the first and second DWI scanning, and the pulse flip angle correction factor is determined according to the excitation pulse flip angle actual value of the second DWI scanning and the excitation pulse flip angle setting value of the second DWI scanning.

Preferably, the preset relationship is that, for the same diffusion sensitive factor, the excitation pulse flip angle setting value of the second DWI scanning is N times the excitation pulse flip angle setting value of the first DWI scanning, wherein N is a positive number, and at this point the excitation pulse flip angle actual value $\alpha_{actual}$ of the first DWI scanning is determined according to the following general formula, wherein:

$$\frac{\sin(N^* \alpha_{actual})}{\sin \alpha_{actual}} = \frac{S_{2,measured}}{S_{1,measured}};$$

where $S_{1,measured}$ denotes the image signal intensity of the first DWI scanning, and $S_{2,measured}$ denotes the image signal intensity of the second DWI scanning.

Preferably, when N is 2, $\alpha_{actual}$ can be calculated easily by a transformation of triangle function. More preferably, the excitation pulse flip angle setting value of the first DWI scanning is 60 degrees, and the excitation pulse flip angle setting value of the second DWI scanning is 120 degrees, thereby acquiring a better correction result.

For example, in the first scanning (repetition 1), when an image is scanned with b=0, the excitation pulse flip angle is set to 60 degrees (namely $\alpha_{nominal}$ is 60 degrees); while for other scannings with b, the excitation pulse flip angles are still set to 90 degrees. The image signal intensity obtained from the scanning is denoted by $S_{1,measured}$, and the expression is:

$$S_{1,measured}=M_0 \sin \alpha_{actual} \sin^2 (\beta_{actual}/2) \times e^{-TE/T2} \times e^{-bD};$$

where $\alpha_{actual}$ is actual excitation pulse flip angle; due to the inhomogeneity of B1 field, and normally $\alpha_{actual}$ is not equal to the set excitation pulse flip angle $\alpha_{nominal}$, the acquired actual image is different from that acquired by theory; $\beta_{actual}$ is refocusing pulse flip angle actual value.

In the second scanning (repetition 2), when an image is scanned with b=0, the excitation pulse flip angle is set to 120 degrees (namely twice 60°); while for other scannings with b value, the excitation pulse flip angles are still set to 90 degrees. The image signal intensity obtained from the scanning is denoted by $S_{2,measured}$, and the expression is:

$$S_{2,measured}=M_0 \sin 2\alpha_{actual} \sin^2 (\beta_{actual}/2) \times e^{-TE/T2} \times e^{-bD}.$$

By a transformation of triangle function, the following equation can be calculated:

$$\alpha_{actual} = \arccos\left(\frac{1}{2}\frac{S_{2,measured}}{S_{1,measured}}\right);$$

$$\frac{\alpha_{actual}}{\alpha_{nominal}}$$

is the ratio of the actual excitation pulse flip angle to the set excitation pulse flip angle, which can reflect the case of inhomogeneity of B1 field, and therefore it can act as a pulse flip angle correction factor to participate in the correction process of a DWI image to be corrected.

In Step 102, a DWI image is corrected based on the pulse flip angle correction factor.

In an embodiment, based on the pulse flip angle correction factor, the excitation pulse flip angle actual value and the refocusing pulse flip angle actual value of DWI scanning corresponding to the DWI image to be corrected are calculated; based on the excitation pulse flip angle actual value and the refocusing pulse flip angle actual value calculated, a launch site correction factor is determined, and the DWI image to be corrected is corrected according to the launch site factor. Here, the launch site factor can be determined based on the excitation pulse flip angle correction factor, and then the DWI image to be corrected is corrected according to the launch site factor, thereby improving the DWI image which has poor imaging quality due to inhomogeneity of the launch site.

According to the pulse flip angle correction factor determined in step 101, the excitation pulse flip angle actual value $\theta_{1,actual}$ and the refocusing pulse flip angle actual value $\theta_{2,actual}$ of the DWI scanning corresponding to the DWI image to be corrected can be calculated respectively as:

$$\theta_{1,actual} = \theta_{1,norminal} \cdot \frac{\alpha_{actual}}{\alpha_{norminal}}; \theta_{2,actual} = \theta_{2,norminal} \cdot \frac{\alpha_{actual}}{\alpha_{norminal}},$$

wherein $\theta_{1,norminal}$ is the excitation pulse flip angle setting value of DWI scanning corresponding to the DWI image to be corrected; and $\theta_{2,norminal}$ is the refocusing pulse flip angle value of DWI scanning corresponding to the DWI image to be corrected.

Therefore, the launch site correction factor $C^+$ for correcting the inhomogeneity of the launch site $B1^+$ is:

$$C^+ = \frac{\sin\theta_{1,norminal} \sin^2(\theta_{2,norminal}/2)}{\sin\theta_{1,actual} \sin^2(\theta_{2,actual}/2)}.$$

Accordingly, the image to be corrected can be corrected homogeneously to acquire a corrected image $S_{corrected}$ as follows:

$$S_{corrected}=S_{measured} \cdot C^+.$$

Thus the inhomogeneity correction of an image to be corrected is realized with respect to the launch site.

In an embodiment, a receiving field correction factor is calculated based on the pulse flip angle correction factor, and the DWI image to be corrected is corrected according to the receiving field correction factor. Here, the receiving field correction factor can be determined based on the pulse flip angle correction factor, and then the DWI image to be corrected is corrected according to the receiving field factor, thereby improving the DWI image which has poor imaging quality due to inhomogeneity of the receiving field.

Here, since the inhomogeneity of an image will also be affected by the receiving field, $(\alpha_{nominal}/\alpha_{actual})$ is used as an inhomogeneity correction factor $C^-$ of the receiving field $B1^-$.

The image to be corrected can be corrected homogeneously to acquire a corrected image $S_{corrected}$ as follows:

$$S_{corrected}=S_{measured} \cdot C^-.$$

Thus the inhomogeneity correction of an image to be corrected is realized with respect to the receiving field.

In an embodiment, based on the pulse flip angle correction factor, the excitation pulse flip angle actual value and the refocusing pulse flip angle actual value of DWI scanning corresponding to the DWI image to be corrected are calculated, based on the excitation pulse flip angle actual value and the refocusing pulse flip angle actual value calculated, a launch site correction factor is determined, and based on the pulse flip angle correction factor, a receiving field correction factor is calculated; and the DWI image to be corrected is corrected according to the receiving field correction factor and the launch site factor. Here, the launch site correction factor and the receiving field correction factor can be determined based on the pulse flip angle correction factor, and then the DWI image to be corrected is corrected according to both the launch site correction factor and the receiving field factor, thereby improving the DWI image which has poor imaging quality due to inhomogeneity of the launch site and inhomogeneity of the receiving field.

Here, according to the pulse flip angle correction factor determined in step 101, the excitation pulse flip angle actual value $\theta_{1,actual}$ and the refocusing pulse flip angle actual value $\theta_{2,actual}$ of DWI scanning corresponding to the DWI image to be corrected can be calculated respectively as:

$$\theta_{1,actual} = \theta_{1,norminal} \cdot \frac{\alpha_{actual}}{\alpha_{norminal}}; \theta_{2,actual} = \theta_{2,norminal} \cdot \frac{\alpha_{actual}}{\alpha_{norminal}},$$

wherein $\theta_{1,norminal}$ is the excitation pulse flip angle setting value of DWI scanning corresponding to the DWI image to be corrected; and $\theta_{2,norminal}$ is the refocusing pulse flip angle value of DWI scanning corresponding to the DWI image to be corrected.

Therefore, the correction factor $C^+$ for correcting the inhomogeneity of the launch site $B1^+$ can be calculated as:

$$C^+ = \frac{\sin\theta_{1,norminal} \sin^2(\theta_{2,norminal}/2)}{\sin\theta_{1,actual} \sin^2(\theta_{2,actual}/2)}.$$

Moreover, a reciprocal of the pulse flip angle correction factor is calculated, and the reciprocal is determined as the receiving field correction factor, namely employing ($\alpha_{norminal}/\alpha_{actual}$) as the correction factor $C^-$ of inhomogeneity of the receiving field.

Accordingly, the inhomogeneity correction of an image to be corrected is corrected homogeneously with respect to the launch site $B1^+$ and the receiving field $B1^-$ to acquire a following corrected image $S_{corrected}$:

$$S_{corrected} = S_{measured} \cdot C^+ \cdot C^-.$$

An embodiment of the present invention is described below in more detail with an example in which, in the first scanning, for b=0, the excitation pulse flip angle is set to 60 degrees; and in the second scanning, for b=0, the excitation pulse flip angle is set to 120 degrees.

Figure 3:
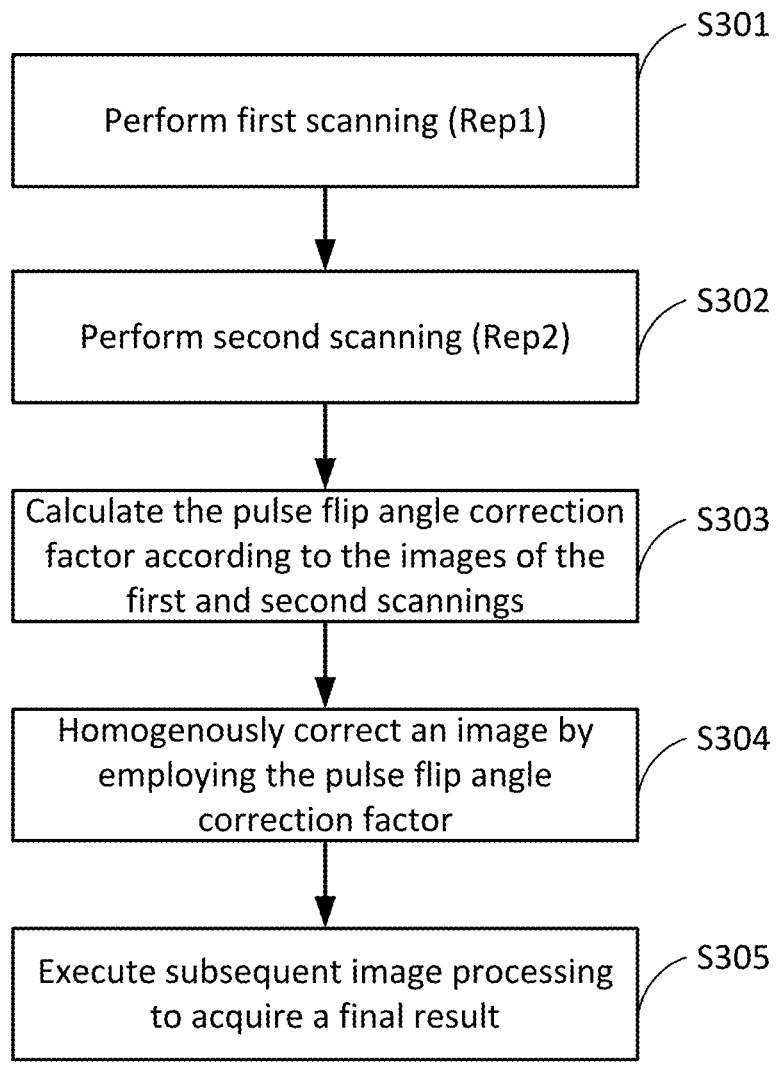
FIG. 3 is a schematic flowchart of a correction method for a magnetic resonance diffusion weighted imaging image of an embodiment of the present invention.

FIG. 3 is a schematic flowchart of a correction method for a magnetic resonance diffusion weighted imaging image of an embodiment of the present invention.

As shown in FIG. 3, in Step S301, in the first scanning (repetition 1), when an image is scanned with b=0, the excitation pulse flip angle is set to 60 degrees; while for the other scanning with b value, the excitation pulse flip angles are still set to 90 (in accordance with the traditional DWI sequence). The image signal intensity obtained from the scanning is denoted by $S_{1,measured}$, and the expression is:

$$S_{1,measured} = M_0 \sin \alpha_{actual} \sin^2(\beta_{actual}/2) \times e^{-TE/T2} \times e^{-bD};$$

wherein $\alpha_{actual}$ is actual excitation pulse flip angle of the first scanning; $\beta_{actual}$ is refocusing pulse flip angle actual value of the first scanning.

In Step S302, in the second scanning (repetition 2), when an image is scanned with b=0, the excitation pulse flip angle is set to 120 degrees (twice 60 degrees); and for the other scanning with b value, the excitation pulse flip angles are still set to 90 (in accordance with the traditional DWI sequence), and the image signal intensity obtained in the scanning is denoted by $S_{2,measured}$ which is expressed as:

$$S_{2,measured} = M_0 \sin 2\alpha_{actual} \sin^2(\beta_{actual}/2) \times e^{-TE/T2} \times e^{-bD}.$$

In Step S303, the pulse flip angle correction factor is calculated according to the images of two scannings with b=0.

According to the images of two scannings with b=0, an actual flip angle $\alpha_{actual}$ is calculated as follows:

$$\alpha_{actual} = \arccos\left(\frac{1}{2}\frac{S_{2,measured}}{S_{1,measured}}\right),$$

wherein $\alpha_{norminal}$ is the set flip angle of an excitation pulse of the first scanning;

$$\frac{\alpha_{actual}}{\alpha_{norminal}}$$

is the ratio of the actual flip angle to the set flip angle and can reflect the case of inhomogeneity of the B1 field, and therefore it can act as an pulse flip angle correction factor to participate in the correction process of the DWI image to be corrected.

In Step S304, the image to be corrected is corrected homogeneously by employing the pulse flip angle correction factor.

In general, a signal formula of a DWI image to be corrected can be expressed as:

$$S = M_0 \sin \theta_1 \sin^2(\theta_2/2) \times e^{-TE/T2} \times e^{-bD};$$

$\theta_1$ and $\theta_2$ are flip angles of the excitation pulse and the refocusing pulse of DWI scanning corresponding to the DWI image to be corrected respectively.

According to $$\frac{\alpha_{actual}}{\alpha_{norminal}}$$

calculated in the previous step, the actual angles of the excitation pulse and refocusing pulse can be calculated respectively:

$$\theta_{1,actual} = \theta_{1,norminal} \cdot \frac{\alpha_{actual}}{\alpha_{norminal}}; \theta_{2,actual} = \theta_{2,norminal} \cdot \frac{\alpha_{actual}}{\alpha_{norminal}};$$

$\theta_{1,norminal}$ is the excitation pulse flip angle setting value of DWI scanning corresponding to the DWI image to be corrected; and $\theta_{2,norminal}$ is the refocusing pulse flip angle setting value of DWI scanning corresponding to the DWI image to be corrected.

Accordingly, the correction factor for correcting inhomogeneity of the field B1 can be calculated:

$$C^+ = \frac{\sin\theta_{1,norminal} \sin^2(\theta_{2,norminal}/2)}{\sin\theta_{1,actual} \sin^2(\theta_{2,actual}/2)};$$

$$C^- = \alpha_{norminal}/\alpha_{actual};$$

The image to be corrected is corrected homogeneously with respect to the launch site $B1^+$ and the receiving field $B1^-$ as following:

$$S_{corrected} = S_{measured} \cdot C^+ \cdot C^-.$$

In Step S305, the subsequent image processing steps are executed. For example, the images acquired in two scannings are averaged, so as to acquire a final result.

Various embodiments are described above in detail, in which an excitation pulse flip angle actual value of the first DWI image scanning is calculated based on the image signal intensity of the first and second DWI scanning and the preset relationship between the excitation pulse flip angle setting values of the first and second DWI scanning, and the launch site correction factor and/or the receiving field correction factor is determined according to the excitation pulse flip angle actual value.

In practice, the excitation pulse flip angle actual value of DWI scanning can also be determined by other any method (such as measurement), and the pulse flip angle correction factor is determined based on the determined ratio of the excitation pulse flip angle actual value to the excitation pulse flip angle setting value. For example, the excitation pulse flip angle actual value of a certain DWI scanning can be measured, and the ratio of the excitation pulse flip angle actual value of the DWI scanning to the excitation pulse flip angle setting value of the DWI scanning is used as the pulse flip angle correction factor. Or, multiple DWI scanning can be executed, so as to measure the excitation pulse flip angle actual value of each DWI scanning, and the ratio of the actual excitation pulse flip angle measurement value of each DWI scanning to the excitation pulse flip angle setting value of the DWI scanning is calculated to obtain multiple candidate pulse flip angle correction factors from which one candidate pulse flip angle correction factor is then selected as the final pulse flip angle correction factor, or the final pulse flip angle correction factor is weighted by these candidate pulse flip angle correction factors according to a weighted algorithm.

The embodiment of calculating the pulse flip angle correction factor is exemplarily described above, and the person skilled in the art may recognize that the description is exemplary only and not intended to limit the protection scope of the present invention.

Based on the above analysis, the embodiments of the present invention disclose a correction apparatus for a magnetic resonance diffusion weighted imaging image.

Figure 4:
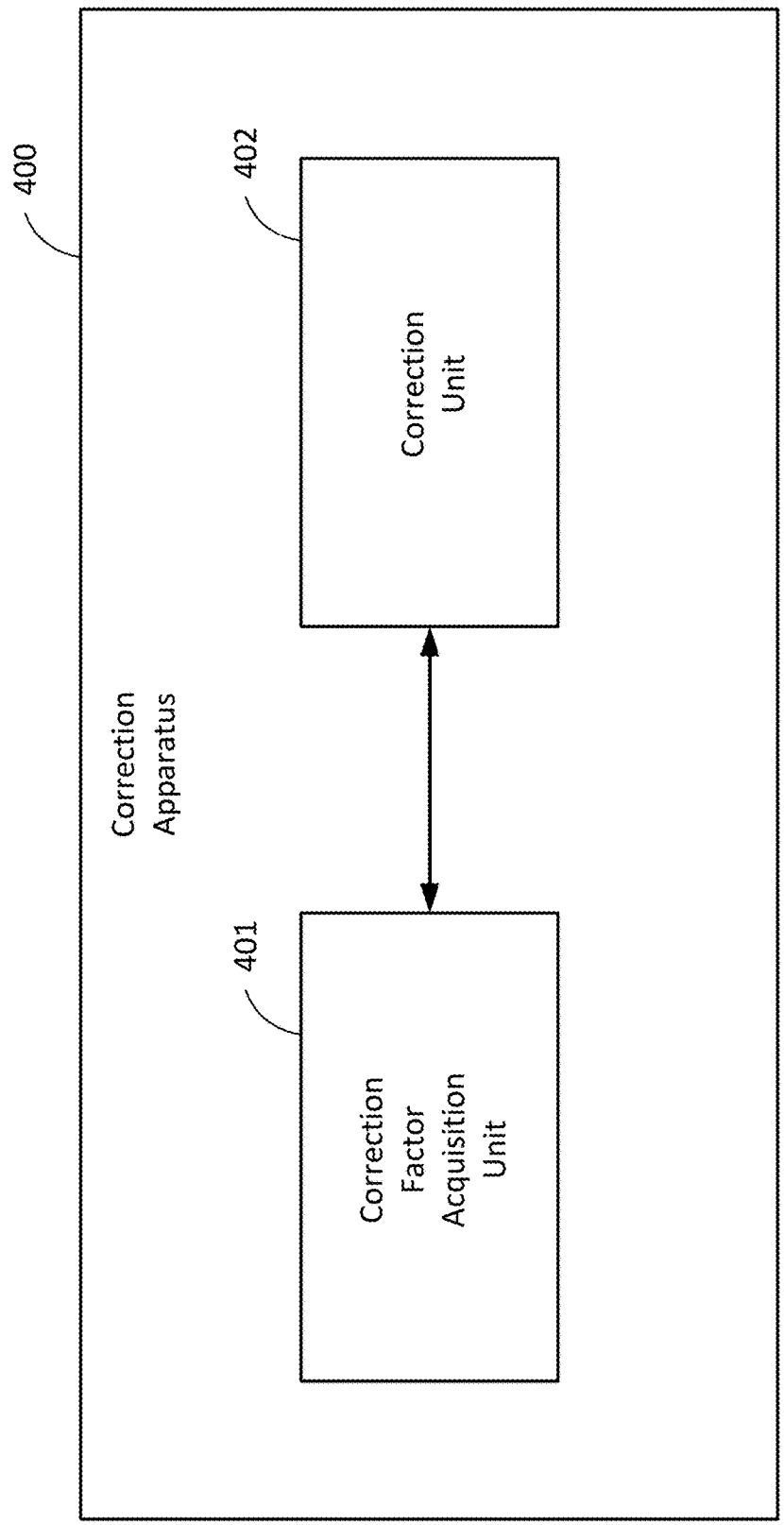
FIG. 4 is a structure diagram of a correction apparatus for a magnetic resonance diffusion weighted imaging image of an embodiment of the present invention.

FIG. 4 is a block diagram of a correction apparatus for, a magnetic resonance diffusion weighted imaging image of an embodiment of the present invention.

As shown in FIG. 4, the correction apparatus 400 for a magnetic resonance diffusion weighted imaging image has a correction factor acquisition unit 401 and a correction unit 402.

The correction factor acquisition unit 401 is designed to acquire a launch site correction factor and/or a receiving field correction factor, wherein the launch site correction factor is used for correcting inhomogeneity of a launch site, and the receiving field correction factor is used for correcting inhomogeneity of a receiving field.

The correction unit 402 is designed to correct a DWI image based on the launch site correction factor and/or the receiving field correction factor.

In an embodiment, the correction factor acquisition unit 401 is designed to determine the launch site correction factor based on an excitation pulse flip angle actual value of the DWI image and a refocusing pulse flip angle actual value corresponding thereto; and/or calculating the receiving field correction factor based on a pulse flip angle correction factor.

In an embodiment, the correction factor acquisition unit 401 is designed to calculate the excitation pulse flip angle actual value and the refocusing pulse flip angle actual value based on the pulse flip angle correction factor.

In an embodiment, the correction factor acquisition unit 401 is designed to calculate, according to the image signal intensity of a first and a second DWI scanning and a preset relationship between the excitation pulse flip angle setting value of the first and second DWI scanning, an excitation pulse flip angle actual value of the first DWI scanning, and, according to a ratio of the excitation pulse flip angle actual value of the first DWI scanning to the excitation pulse flip angle setting value of the first DWI scanning, determine the pulse flip angle correction factor.

Preferably, the preset relationship is: corresponding to the same diffusion sensitive factor, the excitation pulse flip angle setting value of the second DWI scanning is N times the excitation pulse flip angle setting value of the first DWI scanning, wherein N is a positive number, and the excitation pulse flip angle actual value $\alpha_{actual}$ of the first DWI scanning is determined according to the following general formula, wherein:

$$\frac{\sin(N*\alpha_{actual})}{\sin\alpha_{actual}} = \frac{S_{2,measured}}{S_{1,measured}};$$

wherein $S_{1,measured}$ denotes the image signal intensity of the first DWI scanning, and $S_{2,measured}$ denotes the image signal intensity of the second DWI scanning.

Preferably, the value of N is 2. More preferably, the excitation pulse flip angle setting value of the first DWI scanning is 60 degrees, and the excitation pulse flip angle setting value of the second DWI scanning is 120 degrees.

In an embodiment, the correction factor acquisition unit 401 is designed to determine the launch site correction factor, based on an excitation pulse flip angle actual value and a refocusing pulse flip angle actual value corresponding thereto, according to the following general formula:

$$C^+ = \frac{\sin\theta_{1,nominal}\sin^2(\theta_{2,nominal}/2)}{\sin\theta_{1,actual}\sin^2(\theta_{2,actual}/2)},$$

wherein $C^+$ denotes the launch site correction factor, $\theta_{1,actual}$ denotes the excitation pulse flip angle actual value, $\theta_{2,actual}$ denotes the refocusing pulse flip angle actual value corresponding to $\theta_{1,actual}$, $\theta_{1,nominal}$ denotes the excitation pulse flip angle setting value corresponding to $\theta_{1,actual}$, and $\theta_{2,nominal}$ denotes the refocusing pulse flip angle actual value corresponding to $\theta_{1,nominal}$.

In an embodiment, the diffusion sensitive factor is zero.

It should be noted that not all of the steps and modules in each of the above-mentioned flows and structural schematic diagrams are necessary, and it is possible to ignore certain steps or modules according to actual needs. The execution sequence of each step is not fixed and can be adjusted as needed. The division of various modules is merely a division in functions adopted for the purpose of facilitating description, and in actual implementation, one module may be respectively implemented by a plurality of modules, and the functions of the plurality of modules may also be implemented by the same module, and these modules may be located in the same device and may also be located in different devices.

The hardware modules in various embodiments can be realized either mechanically or electronically. For example, a hardware module may comprise a specially designed permanent circuit or logic device (e.g., a dedicated processor, such as FPGA or ASIC) for completing a specific operation. The hardware module may also comprise a programmable logic device or circuit (e.g., comprising a general-purpose processor or other programmable processors)

which is configured by software temporarily for carrying out a specific operation. It can be determined, according to the considerations of cost and time, whether to implement the hardware module specifically adopting the mechanical manner, or adopting a dedicated permanent circuit, or adopting a circuit which is temporarily configured (e.g., configured by software).

The present invention also provides a machine-readable storage medium which stores instructions for making a machine perform the method as described herein. Particularly, a system or a device with a storage medium can be provided, on which storage medium there are stored software program codes for implementing the functions of any of the abovementioned embodiments, and a computer (or CPU or MPU) of the system or device is enabled to read and execute the program codes stored in the storage medium. In addition, some or all of the actual operations can be performed by an operating system executed on a computer with instructions based on program codes. The program codes read from the storage medium can also be written into a memory provided in an extension board inserted inside the computer or into a memory provided in an extension unit connected to the computer, subsequently the instructions based on the program codes cause the CPU mounted on the extension board or the extension unit to carry out part of or all of the practical operations, thereby realizing the function of any one of the above-mentioned embodiments.

The embodiments of the storage medium for providing program codes include a floppy disk, a hard disk, a magnetic optical disk, an optical disk (such as CD-ROM, CD-R, CD-RW, DVD-ROM, DVD-RAM, DVD-RW, and DVD+RW), a magnetic tape, a non-volatility storage card, and a ROM. Selectively, the program codes can be downloaded from a server computer via a communication network.

In summary, the correction method for a magnetic resonance diffusion weighted imaging image of the present invention comprises: correcting a DWI image based on a launch site correction factor and/or a receiving field correction factor, wherein the launch site correction factor is used for correcting inhomogeneity of a launch site, and the receiving field correction factor is used for correcting inhomogeneity of a receiving field. It can be seen that, after applying the embodiments of the present invention, the DWI sequence and the corresponding DWI image reconstruction are improved, and the homogeneity of the DWI image can be improved without measuring intensity of the launch site B1+, which significantly reduces the correction workload and is easy to automate.

Although modifications and changes may be suggested by those skilled in the art, it is the intention of the inventors to embody within the patent warranted hereon all changes and modifications as reasonably and properly come within the scope of their contribution to the art.

We claim:

1. A correction method for a magnetic resonance diffusion weighted imaging (DWI) image, comprising:
   correcting a diffusion weighted imaging image based on a launch site correction factor and/or a receiving field correction factor,
   wherein the launch site correction factor is used for correcting inhomogeneity of a launch site, and the receiving field correction factor is used for correcting inhomogeneity of a receiving field,
   wherein the launch site correction factor and/or the receiving field correction factor are each calculated based upon a modification of an initial excitation pulse flip angle setting value to a modified excitation pulse flip angle setting value that are used as part of the same scanning repetition to perform DWI imaging in different scanning directions, and
   wherein the modified excitation pulse flip angle setting value is used in accordance with the same scanning repetition to perform DWI imaging in the different scanning directions.

2. The correction method as claimed in claim 1, comprising using said launch site correction factor to correct said diffusion weighted imaging image, and determining the launch site correction factor based on an excitation pulse flip angle actual value of the diffusion weighted imaging image and a refocusing pulse flip angle actual value corresponding thereto.

3. The correction method as claimed in claim 2, comprising:
   calculating the excitation pulse flip angle actual value and the refocusing pulse flip angle actual value based on the pulse flip angle correction factor.

4. The correction method as claimed in claim 2, comprising:
   calculating an excitation pulse flip angle actual value of a first diffusion weighted imaging image scanning according to an image signal intensity of the first and a second diffusion weighted imaging image scanning and a preset relationship between excitation pulse flip angle setting values of the first and second diffusion weighted imaging image scanning, and determining the pulse flip angle correction factor according to a ratio of the excitation pulse flip angle actual value of the first diffusion weighted imaging image scanning to the excitation pulse flip angle setting value of the first diffusion weighted imaging image scanning.

5. The correction method as claimed in claim 4, wherein in that the preset relationship is that, for the same diffusion sensitive factor, the excitation pulse flip angle setting value of the second diffusion weighted imaging image scanning is N times the excitation pulse flip angle setting value of the first diffusion weighted imaging image scanning, where N is a positive number, the excitation pulse flip angle actual value $\alpha_{actual}$ of the first diffusion weighted imaging image scanning is determined according to a first general formula, and the first general formula is $$\frac{\operatorname{Sin}(N*\alpha_{actual})}{\operatorname{Sin}\alpha_{actual}} = \frac{S_{2,measured}}{S_{1,measured}},$$

wherein $S_{1,measured}$ denotes the image signal intensity of the first diffusion weighted imaging image scanning, and $S_{2,measured}$ denotes the image signal intensity of the second diffusion weighted imaging image scanning.

6. The correction method as claimed in claim 5, wherein N=2.

7. The correction method as claimed in claim 6, wherein the excitation pulse flip angle setting value of the first diffusion weighted imaging image scanning is 60 degrees.

8. The correction method as claimed in claim 5, wherein the diffusion sensitive factor is zero.

9. The correction method as claimed in claim 2, comprising determining the launch site correction factor, based on an excitation pulse flip angle actual value and a refocusing pulse flip angle actual value corresponding thereto, according to a second general formula, wherein the second general formula is $$C^+ = \frac{\sin\theta_{1,nominal} \sin^2(\theta_{2,nominal}/2)}{\sin\theta_{1,actual} \sin^2(\theta_{2,actual}/2)},$$

wherein $C^+$ denotes the launch site correction factor, $\theta_{1,actual}$ denotes the excitation pulse flip angle actual value, $\theta_{2,actual}$ denotes the refocusing pulse flip angle actual value corresponding to $\theta_{1,actual}$, $\theta_{1,nominal}$ denotes the excitation pulse flip angle setting value corresponding to $\theta_{1,actual}$, and $\theta_{2,nominal}$ denotes the refocusing pulse flip angle actual value corresponding to $\theta_{1,nominal}$.

10. The correction method as claimed in claim 9, wherein the diffusion sensitive factor is zero.

11. The correction method as claimed in claim 1 comprising using said receiving field correction factor for correcting inhomogeneity of a receiving field, and calculating the receiving field correction factor based on a pulse flip angle correction factor.

12. The correction method as claimed in claim 11, comprising calculating the receiving field correction factor based on a pulse flip angle correction factor by:
calculating a reciprocal of the pulse flip angle correction factor, and determining the reciprocal as the receiving field correction factor.

13. A correction apparatus for a magnetic resonance diffusion weighted imaging (DWI) image, comprising a correction factor acquisition unit and a correction unit, wherein:
the correction factor acquisition unit is configured to acquire a launch site correction factor and/or a receiving field correction factor, wherein the launch site correction factor is used for correcting inhomogeneity of a launch site, and the receiving field correction factor is used for correcting inhomogeneity of a receiving field; and
the correction unit is configured to correct a diffusion weighted imaging image based on the launch site correction factor and/or the receiving field correction factor,
wherein the correction factor acquisition unit is configured to calculate the launch site correction factor and/or the receiving field correction factor based upon a modification of an initial excitation pulse flip angle setting value to a modified excitation pulse flip angle setting value that are used as part of the same scanning repetition to perform DWI imaging in different scanning directions, and
wherein the modified excitation pulse flip angle setting value is used in accordance with the same scanning repetition to perform DWI imaging in the different scanning directions.

14. The correction apparatus as claimed in claim 13, wherein:
the correction factor acquisition unit is configured to use said launch site correction factor to correct said diffusion weighted imaging image, and to determine the launch site correction factor based on an excitation pulse flip angle actual value of the diffusion weighted imaging image and a refocusing pulse flip angle actual value corresponding thereto.

15. The correction apparatus as claimed in claim 14, wherein the correction factor acquisition unit is configured to calculate the excitation pulse flip angle actual value and the refocusing pulse flip angle actual value based on the pulse flip angle correction factor.

16. The correction apparatus as claimed in claim 14, wherein the correction factor acquisition unit is configured to calculate an excitation pulse flip angle actual value of a first diffusion weighted imaging image scanning according to an image signal intensity of the first and a second diffusion weighted imaging image scanning and a preset relationship between excitation pulse flip angle setting values of the first and second diffusion weighted imaging image scanning, and determine the pulse flip angle correction factor according to a ratio of the excitation pulse flip angle actual value of the first diffusion weighted imaging image scanning to the excitation pulse flip angle setting value of the first diffusion weighted imaging image scanning.

17. The correction apparatus as claimed in claim 16, wherein the preset relationship is that, for the same diffusion sensitive factor, the excitation pulse flip angle setting value of the second diffusion weighted imaging image scanning is N times the excitation pulse flip angle setting value of the first diffusion weighted imaging image scanning, where N is a positive number, the excitation pulse flip angle actual value $\alpha_{actual}$ of the first diffusion weighted imaging image scanning is determined according to a first general formula, and the first general formula is $$\frac{\sin(N*\alpha_{actual})}{\sin\alpha_{actual}} = \frac{S_{2,measured}}{S_{1,measured}};$$

wherein $S_{1,measured}$ denotes the image signal intensity of the first diffusion weighted imaging image scanning, and $S_{2,measured}$ denotes the image signal intensity of the second diffusion weighted imaging image scanning.

18. The correction apparatus as claimed in claim 17, wherein N=2.

19. The correction apparatus as claimed in claim 18, wherein the excitation pulse flip angle setting value of the first diffusion weighted imaging image scanning is 60 degrees.

20. The correction apparatus as claimed in claim 19, wherein the correction factor acquisition unit is configured to determine the launch site correction factor, based on an excitation pulse flip angle actual value and a refocusing pulse flip angle actual value corresponding thereto, according to a second general formula, wherein the second general formula is $$C^+ = \frac{\sin\theta_{1,nominal} \sin^2(\theta_{2,nominal}/2)}{\sin\theta_{1,actual} \sin^2(\theta_{2,actual}/2)},$$

wherein $C^+$ denotes the launch site correction factor, $\theta_{1,actual}$ denotes the excitation pulse flip angle actual value, $\theta_{2,actual}$ denotes the refocusing pulse flip angle actual value corresponding to $\theta_{1,actual}$, $\theta_{1,nominal}$ denotes the excitation pulse flip angle setting value corresponding to $\theta_{1,actual}$, and $\theta_{2,nominal}$ denotes the refocusing pulse flip angle actual value corresponding to $\theta_{1,nominal}$.

21. The correction apparatus as claimed in claim 17, wherein the diffusion sensitive factor is zero.

22. The correction apparatus as claimed in claim 13 wherein said correction factor acquisition unit is configured to use said receiving field correction factor to correct said diffusion weighted imaging image, and to calculate the receiving field correction factor based on a pulse flip angle correction factor.

23. The correction apparatus as claimed in claim 22, wherein:
the correction factor acquisition unit is configured to calculate a reciprocal of the pulse flip angle correction factor, and to determine the reciprocal as the receiving field correction factor.

\* \* \* \* \*